United States Patent
Frederiksen et al.

(10) Patent No.: US 11,604,230 B2
(45) Date of Patent: Mar. 14, 2023

(54) ELECTRIC CIRCUIT AND DIAGNOSTIC METHOD FOR AN ELECTRIC LOAD

(71) Applicant: Vitesco Technologies GmbH, Hannover (DE)

(72) Inventors: Finn Frederiksen, Schwalbach (DE);
Peter Bauer, Schwalbach (DE);
Georges Maguin, Schwalbach (DE);
Denis Mesmer, Schwalbach (DE);
Cheikh Diouf, Schwalbach (DE)

(73) Assignee: VITESCO TECHNOLOGIES GMBH, Hannover (DE)

(*) Notice: Subject to any disclaimer, the term of this patent is extended or adjusted under 35 U.S.C. 154(b) by 60 days.

(21) Appl. No.: 17/251,166

(22) PCT Filed: Jun. 12, 2019

(86) PCT No.: PCT/EP2019/065315
§ 371 (c)(1),
(2) Date: Dec. 10, 2020

(87) PCT Pub. No.: WO2019/238737
PCT Pub. Date: Dec. 19, 2019

(65) Prior Publication Data
US 2021/0356532 A1    Nov. 18, 2021

(30) Foreign Application Priority Data

Jun. 12, 2018  (EP) .................................... 18177343

(51) Int. Cl.
*G01R 31/52* (2020.01)
*G01R 19/165* (2006.01)
*F01N 3/20* (2006.01)

(52) U.S. Cl.
CPC ....... *G01R 31/52* (2020.01); *G01R 19/16571* (2013.01); *F01N 3/2013* (2013.01); *F01N 3/2066* (2013.01)

(58) Field of Classification Search
CPC .............. G01R 31/00; G01R 31/50–58; G01R 31/66–67; F01N 3/2066; F01N 2240/16
See application file for complete search history.

(56) References Cited

U.S. PATENT DOCUMENTS

| 6,094,975 A | 8/2000 | Hasegawa et al. |
| 2002/0000436 A1 | 1/2002 | Hashimoto et al. |

(Continued)

FOREIGN PATENT DOCUMENTS

| CN | 103003483 | 3/2013 |
| CN | 105445602 | 3/2016 |

(Continued)

OTHER PUBLICATIONS

International Search Report issued in corresponding PCT Application PCT/EP2019/065315.

(Continued)

*Primary Examiner* — Patrick Assouad
*Assistant Examiner* — Demetrius R Pretlow
(74) *Attorney, Agent, or Firm* — Cozen O'Connor

(57) ABSTRACT

An electric circuit for driving a current through a load resistance in a first state and isolating the load resistance in a second state includes: a first switch configured to connect a first terminal of the load resistance and a first port of the electric circuit, the first switch having a first electric potential; a second switch configured to connect a second terminal of the load resistance and a second port of the electric circuit, the second switch having a second electric potential, different from the first electric potential; and at least one auxiliary resistance included within a bypass line configured to bypass (Continued)

the load resistance and the second switch. The first switch is configured to switch a current flowing through the first switch, and the second switch is configured to switch a current flowing through the second switch.

10 Claims, 1 Drawing Sheet

(56) References Cited

U.S. PATENT DOCUMENTS

| | | | | |
|---|---|---|---|---|
| 2010/0271052 A1* | 10/2010 | Ishikawa | ............... | G01R 31/54 324/686 |
| 2014/0182272 A1 | 7/2014 | Czimmek et al. | | |
| 2015/0188487 A1* | 7/2015 | Yoshidomi | ............. | H02S 50/10 324/761.01 |
| 2017/0299644 A1* | 10/2017 | Kaltenegger | ........ | H03K 17/687 |
| 2019/0086464 A1* | 3/2019 | Kawamura | .......... | G01R 27/025 |
| 2019/0195931 A1* | 6/2019 | Kawamura | ........... | B60L 3/0069 |
| 2021/0199706 A1* | 7/2021 | Zeng | ..................... | G01R 31/007 |
| 2021/0272395 A1* | 9/2021 | Kanno | ................. | G07C 5/0816 |

FOREIGN PATENT DOCUMENTS

| | | | | |
|---|---|---|---|---|
| GB | 1570764 A | * | 7/1980 | .......... B60Q 11/007 |
| JP | 2002-021631 | | 1/2002 | |
| JP | 37-60558 B2 | | 3/2006 | |

OTHER PUBLICATIONS

Written Opinion issued in corresponding PCT Application PCT/EP2019/065315.

Office Action dated May 9, 2022 issued in Chinese Patent Application No. 201980038735.4.

Office Action dated Apr. 18, 2022 issued in Korean Patent Application No. 10-2021-7000868.

* cited by examiner

ELECTRIC CIRCUIT AND DIAGNOSTIC METHOD FOR AN ELECTRIC LOAD

CROSS REFERENCE TO RELATED APPLICATIONS

This is a U.S. national stage of International application No. PCT/EP2019/065315, filed on Jun. 12, 2019, which claims priority to European Application No. 18177343.3, filed Jun. 12, 2018, the content of each of which is incorporated herein by reference.

BACKGROUND OF THE INVENTION

1. Field of the Invention

The invention relates to an electric circuit configured for driving a current through at least one load resistance in a first state and for isolating the at least one load resistance in a second state. The invention also relates to a method for detecting an open circuit failure in the electric circuit.

2. Background of the Invention

Various electric circuit configurations are known in which currents can be driven through electric loads. In particular in automotive applications, it is thereby desired to not only have a means provided for switching the load resistance off if required (e.g., by a switch), but also for isolating the load resistance from any other component of the electric circuit. This can be achieved, for example, by having one switch provided on each side of the load resistance. In these configuration both switches are arranged in a serial connection. The load resistance is arranged between both switches.

In some applications, such as those with a resistive heater being the load resistance, one of the two switches may be switched in a frequent manner (in particular periodically). This is the case, for example with electric resistive heaters in selective catalyst reduction (SCR) systems as load resistance. Such load resistances are often operated by a pulse-width-modulated (PWM)-signal. This enables to control the electric power transferred to the load resistance in a precise manner. In case of electrical switches on each sides (or in other words on both sides) of the load resistance, it is sometimes not possible to detect an open circuit failure in the electric circuit. An open circuit failure can be any unintended opening in the electric circuit, such as a cable failure, a switch failure or a load resistance failure. With an open circuit failure, no current can be driven through the electric circuit. Hence, the electric circuit cannot be used as intended. With two switches which are arranged in a serial connection, it is much more difficult to identify what an open circuit failure can be, because whenever the second switch is switched off, no current can flow through the electric circuit, regardless of any open circuit failures. It cannot be distinguished if no current can flow because of the switch being switched off, and/or because of an open circuit failure.

However, being able to detect an open circuit failure even in a situation as described can be important. In particular, in complex systems such as in an automobile with many different electric components, an automated detection of a failure of one of these electric components can be of great importance. In particular, this is the case for applications which have to be monitored by an On Board Diagnosis System (OBD).

SUMMARY OF THE INVENTION

It is, therefore, an object of the present invention to overcome at least in part the disadvantages known from prior art and, in particular, to provide an electric circuit for driving a current through at least one load resistance in a first state and for isolating the at least one load resistance in a second state, wherein an open circuit failure can be efficiently detected. Further, a method for detecting an open circuit failure in such an electric circuit is provided.

The electric circuit according to an aspect of the present invention is configured for driving a current through at least one load resistance in a first state and for isolating the at least one load resistance in a second state. The electric circuit comprises:

at least one first switch connecting a first terminal of the at least one load resistance and a first port of the electric circuit, which has a first electric potential, at least one second switch connecting a second terminal of the at least one load resistance and a second port of the electric circuit, which has a second electric potential, which is different from the first electric potential, and at least one auxiliary resistance comprised within a bypass line that bypasses the at least one load resistance and the at least one second switch, wherein the at least one first switch is configured at least for switching a current flowing through the at least one first switch, and wherein the at least one second switch is configured at least for switching a current flowing through the at least one second switch.

The load resistance may be a resistor as such or any other electric device having an electric resistance. The load resistance may have any resistance value. However, it is preferred that other components of the electric circuit are adapted to the resistance value of the load resistance. In particular, potentially occurring maximal voltage drops across the load resistance are preferably limited according to the specification of the load resistance. Further, parameters of the electric circuit such as diameters of cables are preferably adapted to the resistance value of the load resistance.

The at least one first switch is preferably a switch for switching on and off a connection between two terminals of the switch. It is preferably realized by means of a button, a taster, a toggle switch, an electric switch such as a transistor, or by any other similar structure. The same is true for the at least one second switch. The at least one first switch may, in some applications, be referred to as a "high side switch", while the at least one second switch may be referred to as a "low side switch".

In the first state a voltage drop across the load resistance causes a current to flow through the load resistance. The voltage drop may be the result of having a voltage source or similar potential reservoir connected to the first terminal of the load resistance, and a drain such as a ground connected to the second terminal of the load resistance. In the second state there is not only no voltage drop across the load resistance, but also both terminals of the load resistance are not connected to any other components of the electric circuit, i.e., the load resistance is isolated to both sides. This may prevent damage from the load resistance. Further, in complex systems, the at least one first switch and/or the at least one second switch may be used for multiple purposes. The load resistance may be switched off if at least one of the switches is switched off. That is, depending on when the at least one first switch and/or the at least one second switch are switched off (potentially for one of the mentioned further purposes), no current flows through the load resistance.

The electric circuit comprises at least a first port and a second port. Via these two ports, the electric circuit may be included into a larger overall electric circuit. The larger overall electric circuit can, for example, be part of or connected to a controller of an automobile. It may also be part of an electric power system of an automobile. Whenever the first electric potential is different from the second electric potential, a current may flow through the at least one load resistance depending on the states of the at least one first switch and the at least one second switch. Thereby, it is preferred that the first electric potential is higher than the second electric potential. It is preferred that the first electric potential is created by a voltage source such as a battery that is connected to the first port of the electric circuit (i.e., the positive terminal of the voltage source or the battery may be connected to the first port of the electric circuit). However, any another realization of having the first port of the electric circuit at the first electric potential is equally possible. In particular, it is preferred that the larger overall electric circuit has an interface that provides the first electric potential to the first port of the electric circuit. The second electric potential may be generated in a similar way as the first potential. It is preferred that the second port of the electric circuit is connected to a negative terminal of the voltage source, the positive terminal of which being connected to the first port of the electric circuit. Alternatively, it is preferred that the second port of the electric circuit is grounded, i.e., that the second electric potential is zero. Also, it is preferred that the second electric potential is provided by an interface of the larger overall electric circuit.

If the first electric potential is higher than the second electric potential, a current may flow from the first port of the electric circuit through the at least one first switch (if switched on), through the at least one load resistance, through the at least one second switch (if switched on) and eventually drain into the second port of the electric circuit (wherein the technical current direction is considered). If at least one of the switches is switched off, no such current flows.

As described above, an open circuit failure in an electric circuit comprising only the two switches and the load resistance may not be detectable with one of the switches being switched off. Overcoming this issue, the at least one auxiliary resistance comprised within the bypass line provides a possibility for the current to flow from the first port to the second port of the electric circuit even with the at least one second switch being switched off. As in many applications it is particularly the at least one second switch which is switched in a frequent (in particular periodical) manner, the bypass line with the at least one auxiliary resistance may ensure the detectability of open circuit failures in the electric circuit. Further, open circuit failures outside the electric circuit may be detectable. That is, whenever the first port and/or the second port of the electric circuit are not at the first and second electric potential, respectively, the current flowing through the at least one first switch deviates from what is expected. If, for example, the second port of the electric circuit is isolated from relevant parts of the larger overall electric circuit due to an open circuit failure within the larger overall electric circuit, the current cannot drain at the second port of the electric circuit. Such a failure may be detectable as well.

The at least one auxiliary resistance is preferably connected in parallel to the at least one load resistance and the at least one second switch by the bypass line. Therein, the bypass line may be a cable or other electric connection line. The at least one auxiliary resistance may be any resistor or other electric device having an electric resistance. It is possible that the auxiliary resistance has an additional purpose besides ensuring the detectability of open circuit failures in the electric circuit. For example, the auxiliary resistance may be a (further) resistive heater. The auxiliary resistance may also be referred to as a test resistance or test load. Preferably, the resistance value of the auxiliary resistance is much higher than the resistance value of the load resistance. In particular, preferably it is at least ten times higher or even at least 100 times higher or 1000 times higher. This is in particular the case if the auxiliary resistance has only a test function. Then, the high resistance causes a small loss of electrical power through the auxiliary resistance.

It is preferred that there is exactly one first switch. Further, it is preferred that there is exactly one second switch. Further, it is preferred that there is exactly one load resistance. Further, it is preferred that there is exactly one auxiliary resistance. However, it is possible that there exists more than one first switch, second switch or load resistance. In case that there is more than one of these components it is possible that these components are connected in a serial connection or in a parallel connection.

In a preferred embodiment of the electric circuit the at least one first switch is further configured for generating and outputting a feedback signal depending on the current flowing through the at least one first switch.

The feedback signal is preferably an electric signal, in particular an electric current. Further, it is preferred that the feedback signal is related to the strength of the current flowing through the at least one first switch. In particular, it is preferred that the feedback signal is proportional to the current flowing through the at least one first switch. The feedback signal is preferably generated by the at least one first switch, which preferably not only comprises a switching means, but also a current measuring device such as an amperemeter. A measurement signal outputted by the current measuring device is preferably converted into the feedback signal. The feedback signal may be either a digital or an analog signal. The feedback signal may be outputted from the at least one first switch via a feedback line. Due to the functionality of generating and outputting the feedback signal the at least one first switch may also be referred to as an intelligent (high side) switch.

With the feedback signal representing the current flowing through the at least one first switch, an open circuit failure may be revealed in the feedback signal. Hence, an open circuit failure may be detected by monitoring the feedback signal.

In a further preferred embodiment of the electric circuit the at least one first switch is connected to a microcontroller, wherein the microcontroller is configured for receiving and processing the feedback signal, and for controlling the at least one first switch.

The microcontroller may be any computer chip or electric circuitry, potentially equipped with a software, that is capable of controlling the at least one first switch and of receiving and processing the feedback signal. That is, it is preferred that the microcontroller is connected to the feedback line. Further, it is preferred that the microcontroller is capable of converting the feedback signal into a format suitable for further processing. The microcontroller may be an On Board Diagnosis system of an automobile or it may be a part of such an On Board Diagnosis system.

In particular, it is preferred that the microcontroller is configured for monitoring the feedback signal and for detecting an open circuit failure from the feedback signal. It is further preferred that the microcontroller is configured for triggering actions once an open circuit failure has been detected. Such actions preferably include at least one of the following: switching off the at least one first switch, switching off the at least one second switch, switching off a further electronic component (such as a voltage source that provides the first electric potential), generating an error signal (in particular for processing within the larger overall electric circuit), directly emitting a signal (such as an optical or acoustical signal accessible for an operator or control person), activating a preferably provided substitute for the electric circuit (or parts of it) and causing a recording device to record the detected failure for later analysis.

The controlling of the at least one first switch by the microcontroller preferably includes the above mentioned switching off of the at least one first switch as a result of an open circuit failure. Further, it is preferred that the microcontroller is configured for causing the at least one first switch to be switched whenever this is required. This may depend on the particular application. Therefore, the microcontroller preferably processes information. This information may optionally involve inputs from external sources such as measurement values obtained by gauges, or commands generated by other electric components to which the microcontroller is connected. When the at least one first switch is scheduled to be switched (for example due to a time dependent switching schedule stored within the microcontroller) or otherwise required to be switched (for example as a result of processing information or commands as described above), the microcontroller preferably initiates the switching.

In a further preferred embodiment of the electric circuit the at least one second switch is connected to a controller, wherein the controller is configured for controlling the at least one second switch.

It is preferred that the controller is configured for switching the at least one second switch on and off frequently, in particular periodically. Any on/off signal can be applied to the at least one second switch. In particular, it is preferred to have a pulse width modulated (PWM)-signal being applied to the at least one second switch by the controller. With the frequent or periodic switching of the at least one second switch the power in the at least one load resistance can be controlled. Preferably, the at least one second switch is realized by a transistor having a gate terminal. The controller then is preferably connected to the gate terminal of the transistor. The controller is preferably controlled by the microcontroller. Alternatively, the controller preferably operates autonomously, in particular based on temperature sensing. A temperature sensor may be a part of the controller for this purpose.

The controlling of the at least one second switch by the controller preferably includes the above mentioned switching off of the at least one second switch as a result of an open circuit failure. Further, it is preferred that the controller is configured for causing the at least one second switch to be switched whenever required (depending on the particular application). Therefore, the controller preferably processes information (optionally involving inputs from external sources such as measurement values obtained by gauges, or commands generated by other electric components the controller is connected to, including the microcontroller). When the at least one second switch is scheduled to be switched (for example due to a time dependent switching schedule stored within the controller) or otherwise required to be switched (for example as a result of processing information or commands as described above), the controller preferably initiates the switching.

It is preferred that the at least one second switch, the at least one load resistance, the controller and the at least one auxiliary resistance are comprised within a load. Further, one or more sensing probes are preferably included within the load.

Therein, the functionality of the listed devices is preferably not altered. With the listed devices being comprised within the load, only a single device (i.e., the load) has to be handled. If an open circuit failure is detected, the load can be replaced. This may be more efficient and less expensive than analyzing and optionally repairing the single components. Also, in cases where originally only a load resistance and a controller were used without the bypass line with the auxiliary resistance, the old load resistance and the old controller may be replaced by the load (which, therefore, preferably has an appropriate size, shape and connectability). That way, the detectability of open circuit failures may be easily retrofitted into existing systems.

The invention may be applied in a resistive heater for selective catalyst reduction (SCR) systems, wherein the resistive heater is comprised as the load resistance within an electric circuit as described.

The details and advantages disclosed for the electric circuit are applicable to the resistive heater, and vice versa.

Selective catalytic reduction (SCR) is commonly used in automobiles for reducing pollutant substances in the exhaust gas. In particular, SCR systems are used to reduce nitrogen oxides (NO, NO2). Therefore, urea is introduced into the exhaust gas system. Thereby, particularly ammonia is included in the process. For efficiently reducing nitrogen oxides, the ammonia is preferably vaporized. Therefore, a resistive heater may be used. In this context, the controller preferably causes the at least one second switch to be switched in such a way that the heating power generated by the resistive heater corresponds to the heat required for vaporizing a respectively needed amount of ammonia. In particular it is preferred that the controller comprises or is connected to a sensor for detecting the temperature generated by the resistive heater. Further, the controller preferably comprises or is connected to structure that detects the required amount of vaporized ammonia. Alternatively and/or additionally, the controller is preferably coupled to a control unit of the automobile. As commonly there is only one switch provided in an SCR system, the above described embodiment comprising the load is preferred. In particular in this context, the load may be used instead of the load resistance and the controller as described above.

A further important application of the electric circuit in the field of selective catalytic reduction (SCR) are resistive heaters as load resistance which have the propose to thaw frozen reducing agent and/or which prevent a freezing of liquid reducing agent. Such liquid reducing agent is often use as ammonia precursor. The reducing agent is used to produce ammonia inside the exhaust system or exhaust system externally in an ammonia generator for this purpose. An important and well known ammonia precursor is AdBlue which is an urea water solution with an urea fraction of 32.5%.

According to a further aspect of the present invention a method is provided for detecting an open circuit failure in an electric circuit as described. The method comprises at least monitoring a monitored current, which is the current flowing through the at least one first switch, wherein an open circuit failure is detected by a deviation of the monitored current from an expected value.

The details and advantages disclosed for the electric circuit and the resistive heater are applicable to the method and vice versa.

Monitoring the monitored current is preferably performed by using the microcontroller. Thereby, the value of the monitored current may be compared to a predefined expected value, which, preferably is stored within the microcontroller. Whenever the monitored current falls below the expected value, this may be an indication for an open circuit failure. Therein, the open circuit failure does not have to be realized in terms of a complete opening of the circuit (such as a wire breakage). Also, a significant increase in the circuit resistance may be detectable. Preferably, not only the open circuit failure itself, but also the amount of resistance increase is detected (and optionally recorded and/or further processed).

According to a preferred embodiment of the method, the monitored current is detected by a feedback signal generated and outputted by the at least one first switch.

As described above, the feedback signal is preferably directly related to the monitored current. That is, the value of the monitored current (strength) can be calculated from the feedback signal. The feedback signal is preferably used for transmitting the information about the value of the monitored current (strength) from the at least one first switch to the microcontroller, where it can be further processed.

According to a further preferred embodiment the method further comprises performing a diagnostics sequence, wherein the diagnostics sequence comprises the following steps:
A) switching the one first switch,
B) switching the one second switch,
C) from a first point of time until a second point of time, detecting the monitored current with the at least one first switch being in its on state and the at least one second switch being in its off state,
wherein the diagnostics sequence is followed by a regular operation of the electric circuit.

As in step C) the at least one first switch is supposed to be in its on state and the at least one second switch is supposed to be in its off state, steps A) and B) are previously performed as necessary. That is, if the at least one first switch is not already in its on state, step A) is performed to switch the at least one first switch on. Further, if the at least one second switch is not already in its off state, step B) is performed to switch the at least one second switch off.

The monitored current detected in step C) has a value corresponding to only the bypass line with the auxiliary resistance being accessible (i.e., no current can flow through the load resistance). The value of the current strength of the monitored current detected in step C) can be useful in further operation because the monitored current can only fall below this value if there is a failure, in particular an open circuit failure. That is, the value of the current strength of the monitored current detected in step C) corresponds to the above described expected value for monitored current (that corresponds to the feedback signal). Hence, it is preferred that value received during step C) is stored (preferably within the microcontroller) and afterwards used as the expected value. If the electric current in step C) is not changing this indicates a short circuit to ground. If the electric current in step C) drop to zero this indicates an open circuit/open loop.

In the regular operation of the electric circuit, the switches are switched no longer according to the specifications of the diagnostics sequence. In particular, the above described frequent (or periodical) switching of the at least one second switch is preferably comprised within the regular operation of the electric circuit.

According to a further preferred embodiment of the method the diagnostics sequence further comprises the following steps:
a) switching the at least one first switch,
b) switching the at least one second switch,
c) from an initial point of time until the first point of time, detecting the monitored current with both the at least one first switch and the at least one second switch being in their on states.

The initial point of time lies preferably before the first and second points of time. Steps a), b) and c) are preferably performed prior to steps A), B) and C). Therein, steps a) and b) are performed as needed, similar to what has been described for steps A) and B). That is, depending on the initial states of the first and second switches, steps a) and b) are performed in order to bring both the at least one first switch and the at least one second switch into their on states at the initial point of time. However, it is preferred that before the initial point of time at least the at least one first switch is in its off state, so that no current at all can flow through the electric circuit.

With both the at least one first switch and the at least one second switch being in their on states, both the load resistance and the auxiliary resistance may be flown through by a current. That is, in step c) the maximal current value for the monitored current may be detected. This information may also be valuable in further processing. In particular, the difference between the current strengths detected in steps c) and C) can be used for setting a threshold value for triggering the open circuit failure detection. Further, step c) may initially ensure that there is no failure in the line comprising the load resistance.

According to a further preferred embodiment of the method, the diagnostics sequence further comprises the following steps:
D) switching the at least one second switch,
E) from the second point of time until the third point of time detecting the monitored current with both the at least one first switch and the at least one second switch being in their on states.

The third point of time lies preferably after the initial, first and second points of time. Steps a), b) and c) are preferably performed prior to steps A), B) and C). Therein, step D) is performed as needed, similar to what has been described for steps A), B), a) and b). With no other steps being performed between steps C) and E), in step D) the at least one second switch has to be switched on. In any case, after step D) the at least one second switch is supposed to be in its on state at the second point of time. Preferably from the third point of time onwards, the regular operation of the electric circuit is performed.

Between the second point of time and the third point of time the maximal current as described for step c) may be detected again. This may be valuable for an end of line testing.

Preferably, steps a) and b) happen at a point in time named t0. Preferably, steps A) and B) happen at a point in time named t1. Step c) is active during a time period between t0 and t1. Furthermore preferred, Step D) happens at a point in time named t3. Step c) is active during a time period between t0 and t1. Step C) is active during a time period between t1 and t2. Subsequent step E) is active during a time period after step t2. End of step E) can be defined by a point in time named t3.

Purpose of step c) (in the period t0 to t1) is to make sure that the load is working as intended—it can be switched on and there is no open loop. Purpose of step C) (in the period t1 to t2) is to make sure that the second switch can switch off and there is no open loop and nor short circuits to ground.

From t2 and onwards the circuit is operating as intended and the current level could be the highest value (second switch is on state) or the lowest value (second switch is off state).

BRIEF DESCRIPTION OF THE DRAWINGS

It should be noted that the individual features specified in the claims may be combined with one another in any desired technological reasonable manner and form further embodiments of the invention. The specification, in particular in connection with the drawings, explains the invention further and specifies particularly preferred embodiments of the invention. Particularly preferred variants of the invention, and also the technological field, will now be explained in more detail on the basis of the enclosed figures. It should be noted that the exemplary embodiments shown in the drawings are not intended to restrict the invention. The figures are schematic and may not be to scale. In the drawings:

DETAILED DESCRIPTION OF THE PRESENTLY PREFERRED EMBODIMENTS

Figure 1:
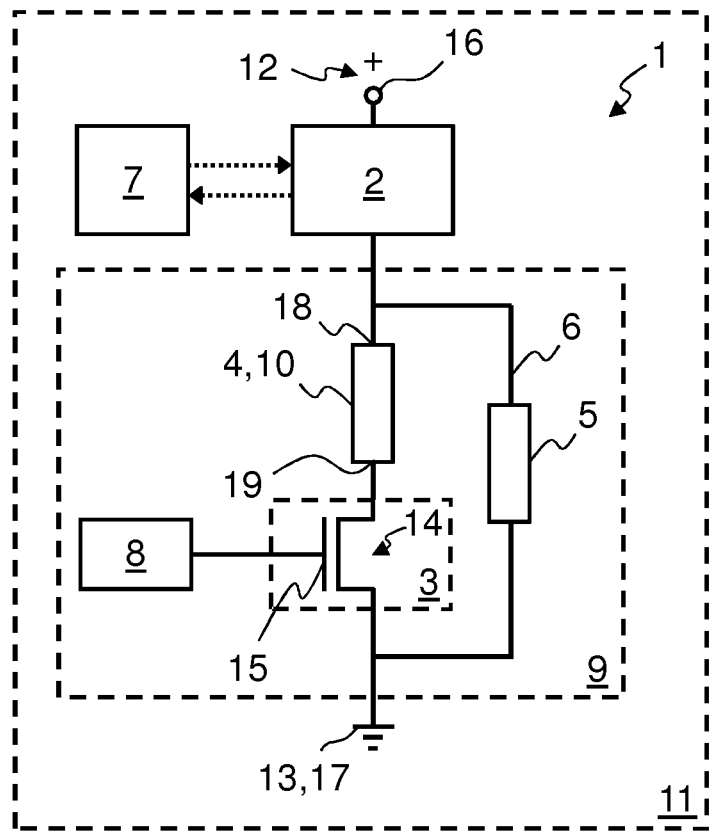
FIG. 1: is a circuit diagram of an electric circuit according to the present invention.

FIG. 1 shows an electric circuit 1, which is comprised within a selective catalyst reduction (SCR) system 11. The electric circuit 1 comprises a first switch 2, which is connected to a positive terminal of a voltage source 12, which is a first port 16 of the electric circuit 1. Further, the first switch 2 is connected to a first terminal 18 of a load resistance 4. The first switch 2 is further connected to a microcontroller 7. This is indicated by dotted arrows, one of which indicates that a feedback signal is transmitted from the first switch 2 to the microcontroller 7, another of which indicates that the microcontroller 7 may control the first switch 2. The load resistance 4 is realized as the resistive heater 10. Further, a second terminal 19 of the load resistance 4 is connected to a second switch 3, which is realized as a transistor 14. The second switch 3 is connected to a ground 13, which is a second port 17 of the electric circuit 1. The second switch 3 is connected to a controller 8. The connection is realized by the controller 8 being connected to a gate terminal 15 of the transistor 14. The second switch 3 and the load resistance 4 are bypassed by a bypass line 6, which comprises an auxiliary resistance 5. The second switch 3, the load resistance 4, the controller 8 and the auxiliary resistance 5 are comprised within a load 9.

Figure 2:
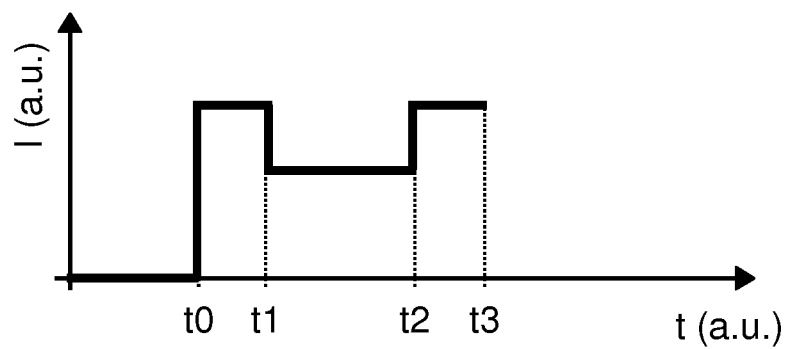
FIG. 2: shows the monitored current as a function of time during the diagnostics sequence.

FIG. 2 is a plot of the monitored current, which is the current flowing through the first switch, as a function of time. The abbreviation "a.u." stands for "arbitrary units". At an initial point of time t0 both the first switch and the second switch are switched into their on states (before, at least the first switch was in its off state). Accordingly, the current may flow through both the load resistance and the auxiliary resistance. The result is a maximum current strength. At the first point of time t1 the second switch is switched off. Accordingly, the monitored current drops to a value between 0 and the maximum value previously detected. This is the case because only the auxiliary resistance is accessible for the current. At a second point of time t2 the second switch is switched on again. The current accordingly rises to its maximum value again. At a third point of time t3 a regular operation of the electric circuit begins. This is not shown further. The period of time between the initial point of time t0 and the third point of time t3 is the diagnostics sequence.

Although exemplary embodiments have been discussed in the above description, it should be noted that numerous modifications are possible. Furthermore, it should be noted that the exemplary embodiments are merely examples which are not intended to limit the scope of protection, the applications and the structure in any way. Rather, a person skilled in the art will take from the above description a guideline for implementation of at least one exemplary embodiment, wherein various modifications may be made, in particular with regard to the function and arrangement of the described components, without departing from the scope of protection as can be gathered from the claims and equivalent feature combinations.

The invention claimed is:

1. An electric circuit (1) configured for driving a current through at least one load resistance (4) in a first state and for isolating the at least one load resistance (4) in a second state, the electric circuit (1) comprising:
   a first switch (2) configured to connect a first terminal (18) of the at least one load resistance (4) and a first port (16) of the electric circuit (1), the first switch (2) having a first electric potential;
   a second switch (3) configured to connect a second terminal (19) of the at least one load resistance (4) and a second port (17) of the electric circuit (1), the second switch (3) having a second electric potential, different from the first electric potential; and
   at least one auxiliary resistance (5) comprised within a bypass line (6) configured to bypass the at least one load resistance (4) and the second switch (3),
   wherein the first switch (2) is configured to switch a current flowing through the first switch (2), and
   wherein the second switch (3) is configured to switch a current flowing through the second switch (3).

2. The electric circuit (1) according to claim 1, wherein the first switch (2) is further configured to generate and output a feedback signal depending on the current flowing through the first switch (2).

3. The electric circuit (1) according to claim 2, wherein the first switch (2) is connected to a microcontroller (7), and wherein the microcontroller (7) is configured to receive and process the feedback signal, and to control the first switch (2).

4. The electric circuit (1) according to claim 1, wherein the second switch (3) is connected to a controller (8), and wherein the controller (8) is configured to control the second switch (3).

5. The electric circuit (1) according to claim 1, wherein the load resistance (4) comprises a resistive heater (10) for a selective catalyst reduction (SCR) system (11).

6. A method for detecting an open circuit failure in an electric circuit (1) configured for driving a current through at least one load resistance (4) in a first state and for isolating the at least one load resistance (4) in a second state, the electric circuit (1) having: a first switch (2) configured to connect a first terminal (18) of the at least one load resistance (4) and a first port (16) of the electric circuit (1), the first switch (2) having a first electric potential; a second switch (3) configured to connect a second terminal (19) of the at least one load resistance (4) and a second port (17) of the electric circuit (1), the second switch (3) having a second electric potential, different from the first electric potential; and at least one auxiliary resistance (5) comprised within a bypass line (6) configured to bypass the at least one load resistance (4) and the second switch (3), wherein the first switch (2) is configured to switch a current flowing through the first switch (2), and wherein the second switch (3) is configured to switch a current flowing through the second switch (3), according to claim 1, the method comprising monitoring a monitored current, the monitored current comprising the current flowing through the first switch (2), an open circuit failure being detected by a deviation of the monitored current from an expected value.

7. The method according to claim 6, wherein the monitored current is detected by a feedback signal generated and output by the first switch (2).

8. The method according to claim 7, further comprising performing a diagnostics sequence, wherein the diagnostics sequence comprises:
  A) switching the first switch (2);
  B) switching the second switch (3); and
  C) from a first point of time (t1) until a second point of time (t2), detecting the monitored current with the first switch (2) being in its ON state and the second switch (3) being in its OFF state, wherein the diagnostics sequence is followed by a regular operation of the electric circuit (1).

9. The method according to claim 8, wherein the diagnostics sequence further comprises:
  a) switching the first switch (2);
  b) switching the second switch (3); and
  c) from an initial point of time (t0) until the first point of time (t1), detecting the monitored current with both the first switch (2) and the second switch (3) being in their ON states.

10. The method according to claim 9, wherein the diagnostics sequence further comprises:
  D) switching the second switch (3),
  E) from the second point of time (t2) until a third point of time (t3), detecting the monitored current with both the first switch (2) and the second switch (3) being in their ON states.

* * * * *